(12) United States Patent
Nomoto

(10) Patent No.: US 6,987,554 B2
(45) Date of Patent: Jan. 17, 2006

(54) TEMPERATURE ADJUSTING SYSTEM AND EXPOSURE APPARATUS INCORPORATING THE SAME

(75) Inventor: Makoto Nomoto, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 134 days.

(21) Appl. No.: 10/671,537

(22) Filed: Sep. 29, 2003

(65) Prior Publication Data
US 2004/0182565 A1 Sep. 23, 2004

(30) Foreign Application Priority Data
Oct. 2, 2002 (JP) ............................. 2002-290146

(51) Int. Cl.
G03B 27/42 (2006.01)
G03B 27/52 (2006.01)

(52) U.S. Cl. .......................... 355/53; 355/30

(58) Field of Classification Search ................ 355/30, 355/53–67
See application file for complete search history.

(56) References Cited

U.S. PATENT DOCUMENTS

| | | | |
|---|---|---|---|
| 4,704,348 A * | 11/1987 | Koizumi et al. | 430/327 |
| 4,786,947 A * | 11/1988 | Kosugi et al. | 355/30 |
| 5,696,623 A * | 12/1997 | Fujie et al. | 359/350 |
| 6,335,787 B1 | 1/2002 | Nishi | 355/67 |
| 6,545,746 B1 | 4/2003 | Nishi | 355/53 |
| 6,616,898 B2 | 9/2003 | Hara et al. | 422/112 |
| 6,700,641 B2 * | 3/2004 | Shiraishi | 355/30 |
| 6,707,529 B1 * | 3/2004 | Aoki et al. | 355/30 |
| 2002/0094306 A1 | 7/2002 | Hara et al. | 422/112 |
| 2003/0151728 A1 | 8/2003 | Nishi | 355/30 |

FOREIGN PATENT DOCUMENTS

| | | |
|---|---|---|
| JP | 9-246140 | 9/1997 |
| JP | 11-312640 | 11/1999 |

OTHER PUBLICATIONS

Japanese Office Action dated Aug. 5, 2005, issued in corresponding Japanese patent application No. 2002-290146.

* cited by examiner

Primary Examiner—Henry Hung Nguyen
(74) Attorney, Agent, or Firm—Fitzpatrick, Cella, Harper & Scinto

(57) ABSTRACT

An apparatus including a chamber, a cooler, a circulating path, a first path, a second path, a first shut-off valve, and a second shut-off valve. The cooler cools an inert gas to be supplied to the chamber. The inert gas flows through the chamber and the cooler in the circulating path. The first path, connected to the circulating path at a first position downstream of an outlet port of the cooler and upstream of the chamber, introduces air to the circulating path. The second path, connected to the circulating path at a second position downstream of the chamber and upstream of an inlet port of the cooler, exhausts gas in the chamber. The first shut-off valve, arranged in the circulating path upstream of the first position and downstream of the outlet port of the cooler, closes before the introduction of the air. The second shut-off valve, arranged in the circulating path downstream of the second position and upstream of the inlet port of the cooler, closes, to prevent the air from flowing to the cooler.

7 Claims, 5 Drawing Sheets

TEMPERATURE ADJUSTING SYSTEM AND EXPOSURE APPARATUS INCORPORATING THE SAME

FIELD OF THE INVENTION

The present invention relates to a temperature adjusting system and an exposure apparatus incorporating the same.

BACKGROUND OF THE INVENTION

The wavelength of an exposure light source used in the manufacture of semiconductors is becoming shorter as the pattern size shrinks. More specifically, the exposure light source has shifted from an i-line to an excimer laser, and its laser light source has also shifted from KrF to ArF. To establish a finer patterning technique, use of an $F_2$ laser is under study.

To construct an exposure system using an $F_2$ laser as the light source, the problem of attenuation of the exposure light energy must be solved. As the energy of an $F_2$ laser beam is absorbed by the moisture or oxygen contained in the atmosphere, a conventional exposure apparatus cannot be applied as it is.

As a means for enabling adaptation to the $F_2$ laser, a method of sealing a space where exposure light passes with a partition, or the like, and filling this space with an inert gas such as nitrogen may be possible. This system, however, also requires an inert gas temperature adjusting system and a circulating system for setting the temperature of the space in which a wafer and reticle are arranged at a constant temperature and for removing temperature fluctuation.

FIG. 3 is a schematic view of a conventional inert gas circulating system. A wafer space 21 and reticle space 22 in the exposure apparatus main body are surrounded by partitions 23 and the interiors of the partitions 23 serve as sealed spaces. A temperature adjusting gas blow-off portion 24 and exhaust portion 25 are connected to each space.

The temperature adjusting gas blow-off portions 24 are provided with filters 26, respectively. The temperature-adjusted clean inert gas flows are blown off into the wafer space 21 and reticle space 22. The inert gas flows blown off into the wafer space 21 and reticle space 22 absorb heat generated in the wafer space 21 and reticle space 22, and are exhausted through the exhaust portions 25. The inert gas flows are supplied to a cooler 29 through return ducts 28 and are heat-exchanged with a refrigerant 30. Then, the inert gas flows are heated and temperature-adjusted by heaters 31, supplied to the temperature adjusting gas blow-off portions 24, and circulated.

High-purity inert gas flows are supplied in predetermined amounts into the wafer space 21 and reticle space 22 through inert gas injection valves 27, and the gas flows in the wafer space 21 and reticle space 22 are exhausted in predetermined amounts through exhaust valves 35, so that the purities of the inert gas flows in the wafer space 21 and reticle space 22 are maintained.

The inert gas flows are temperature-adjusted in the following manner. Temperature sensors 32 detect the temperatures of the inert gas flows in the wafer space 21 and reticle space 22. Detection signals are supplied to temperature adjusting units 33, and outputs from the temperature adjusting units 33 are supplied to the heaters 31 by PID feedback control. Thus, the inert gas flows are controlled such that their temperatures become constant at portions where the temperature sensors 32 are set. The inert gas flows are circulated by a blower 34 arranged between the cooler 29 and heaters 31.

The conventional inert gas circulating system has the following problems in the case of periodical maintenance such as cleaning a wafer chuck arranged in the sealed space, or trouble such as a wafer lost.

(1) When the operator needs to access the sealed space, the interior of the sealed space is very dangerous as it is filled with the inert gas. Accordingly, an exclusive air purge blower or the like is required.

(2) When the interior of the sealed space is purged with air, the filter absorbs the moisture. Accordingly, when restoring the sealed space to a space filled with the inert gas, the moisture of the filter has a bad influence.

(3) When a gas containing moisture passes through the cooler, condensation occurs. The condensed water adversely influences circulation of the inert gas.

In particular, problems (2) and (3) largely influence the time necessary for purging with the inert gas at the start-up of the exposure apparatus, and may accordingly degrade the throughput remarkably.

SUMMARY OF THE INVENTION

The present invention has been made in view of the above problems, and has as its object to provide a safe, high-productivity temperature adjusting system and an exposure apparatus incorporating the same.

The first aspect of the present invention relates to a temperature adjusting system, comprising a chamber, a cooler which cools an inert gas to be supplied to the chamber, a circulating path which circulates the inert gas through the chamber and the cooler, a first shut-off valve arranged in the circulating path between the chamber and an outlet port of the cooler, and a second shut-off valve arranged in the circulating path between the chamber and an inlet port of the cooler.

A preferred embodiment of the present invention preferably comprises a filter upstream of the first shut-off valve and downstream of the second shut-off valve.

A preferred embodiment of the present invention further preferably comprises a blower arranged in the circulating path upstream of the second shut-off valve.

A preferred embodiment of the present invention further preferably comprises a suction path to be connected to the circulating path downstream of the first shut-off valve through a suction valve in order to introduce a gas in an external atmosphere to the circulating path.

A preferred embodiment of the present invention further preferably comprises an exhaust path to be connected to the circulating path upstream of the second shut-off valve and downstream of the blower through an exhaust valve in order to exhaust a gas in the circulating path to the external atmosphere.

A second aspect of the present invention relates to an exposure apparatus for transferring a pattern onto a substrate with exposure light, comprising a chamber having therein a space where exposure light passes, a cooler which cools an inert gas to be supplied to the chamber, a circulating path which circulates the inert gas through the chamber and the cooler, a first shut-off valve arranged in the circulating path between the chamber and an outlet port of the cooler, and a second shut-off valve arranged in the circulating path between the chamber and an inlet port of the cooler.

A third aspect of the present invention is related to a device manufacturing method, forming a pattern onto a substrate by using an exposure apparatus according to the present invention.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The preferred embodiments of the present invention will be described in detail with reference to the accompanying drawings.

Figure 2:
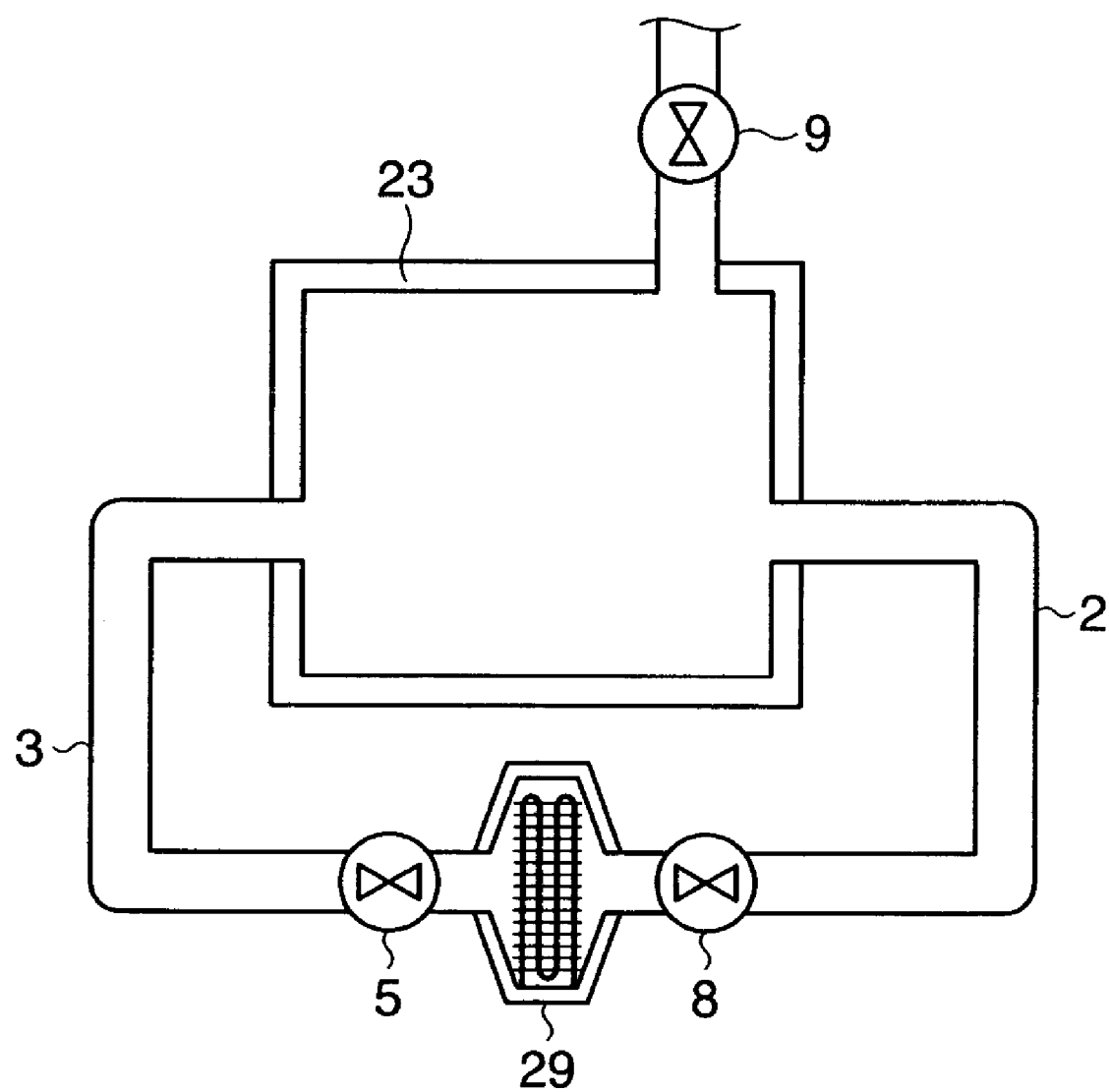
FIG. 2 is a conceptual view showing the arrangement of a temperature adjusting system according to a preferred embodiment of the present invention.
Figure 3:
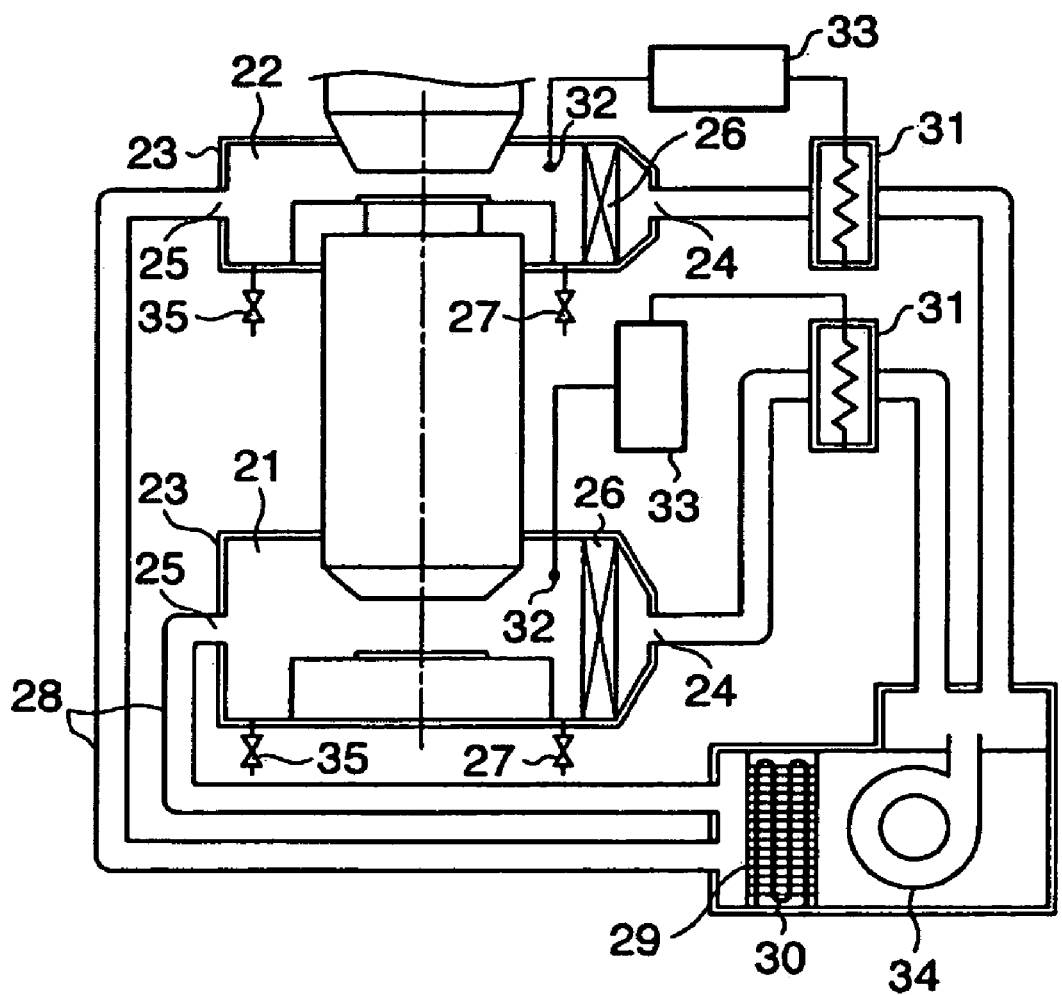
FIG. 3 is a schematic view of a conventional inert gas circulating system.

FIG. 2 is a conceptual view showing the arrangement of a temperature adjusting system according to a preferred embodiment of the present invention.

As shown in FIG. 2, a chamber 23 and a cooler 29 for cooling an inert gas to be supplied to the chamber 23 are connected through pipes to form circulating paths 2 and 3 for circulating the gas cooled by the cooler 29. A shut-off valve 5 is arranged at the inlet port of the cooler 29, and a shut-off valve 8 is arranged at the outlet port of the cooler 29.

During maintenance, or the like, the gas of the external atmosphere such as the air can be introduced into the chamber 23. For example, the gas of the external atmosphere can be introduced to the chamber 23 through an external gas path. The external path can be formed by forming an opening in the chamber 23 and connecting a pipe to the opening. A suction valve 9 is connected to the external gas path. When introducing the gas of the external atmosphere into the chamber 23, both the shut-off valves 5 and 8 are closed and the suction valve 9 is opened.

The temperature adjusting system has a supply unit for supplying a predetermined gas (e.g., inert gas) to the chamber 23, so that it can supply the predetermined gas to the chamber 23. In the temperature adjusting system, even if external air enters the chamber 23 filled with the predetermined gas by leakage, or the like, when both the shut-off valves 5 and 8 are closed, a gas containing moisture will not be condensed by the cooler.

With the above arrangement, in the temperature adjusting system, even if the gas of the external atmosphere is introduced into the chamber, for example, a gas containing moisture can be prevented from passing through the cooler to condense.

(Example)

In the preferred example of the present invention, a case will be described wherein the temperature adjusting system according to the preferred embodiment of the present invention is incorporated in an exposure apparatus.

Figure 1:
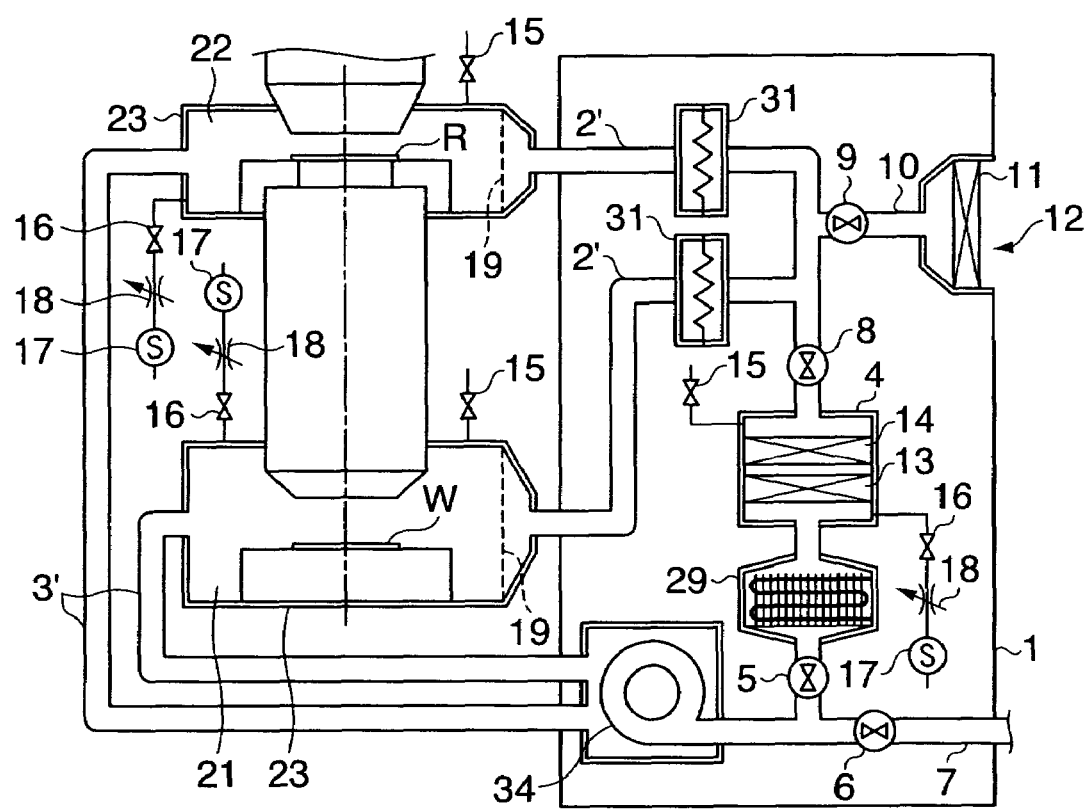
FIG. 1 is a conceptual view showing the arrangement of an exposure apparatus according to a preferred embodiment of the present invention.

FIG. 1 is a conceptual view showing the arrangement of an exposure apparatus according to a preferred example of the present invention. In FIG. 1, the similar elements that are the same as those of the arrangement of the embodiment described above are denoted by the same reference numerals.

As shown in FIG. 1, a wafer space 21 where a substrate (wafer) W is arranged and a reticle space 22 where a master (reticle) R is arranged are surrounded by chambers 23. The wafer space 21 and reticle space 22 are spaces that can be sealed. A temperature adjustment system 1 has circulating paths 2' and 3' for circulating temperature-adjusted inert gas flows in the sealed spaces. More specifically, in the temperature adjustment system 1, temperature adjusting system supply ducts form the circulating paths 2', and return ducts form the circulating paths 3'.

The temperature adjustment system 1 has internal equipment, i.e., a blower 34, a cooler 29, a filter box 4, and heaters 31 that are arranged in this order in the flowing direction of the gas flows in the circulating paths 2' and 3'. A shut-off valve 5 is arranged between the blower 34 and cooler 29. Furthermore, in the circulating paths 2' and 3', an exhaust valve 6 and exhaust path 7 are arranged upstream of the shut-off valve 5. A shut-off valve 8 is arranged downstream of a filter box 4.

In the circulating paths 2' and 3', a suction valve 9 and a suction duct 10 as a suction path are arranged downstream of a shut-off valve 8. The suction valve 9 communicates with the suction duct 10, and the suction duct 10 communicates with a clean room 12 through a filter 11.

In the filter box 4, a chemical filter 13 removes chemical contamination in the gas flows (circulating gas flows) circulating in the circulating paths 2' and 3', and a ULPA filter 14 removes particles in the circulating gas. Each of the wafer space 21, reticle space 22, and filter box 4 has an inert gas injection valve 15 and exhaust valve 16.

When the atmospheric state of the entire system including the wafer space 21, reticle space 22, and the like is to be purged with an inert gas, the respective inert gas injection valves 15 and exhaust valves 16 are opened, the inert gas is injected, and concentration sensors 17 arranged downstream of the exhaust valves 16 measure the inert gas concentration. When the inert gas concentration reaches a predetermined value, circulation of the inert gas flows is started. In this case, both the exhaust valve 6 and suction valve 9 are kept closed.

The inert gas is circulated by opening the shut-off valves 5 and 8 and starting-up the blower 34. The circulating gas supplied to the cooler 29 by the blower 34 is cooled by the cooler 29, and chemical contamination and particles are removed from it by the filter box 4. The circulating gas is then temperature-adjusted to a predetermined temperature by the heaters 31, and is blown off into the respective temperature-adjusted sealed spaces 21 and 22. At this time, in order to maintain the inert gas concentration of the entire system, it is preferable to open the inert gas injection valves 15 and exhaust valves 16, to constantly inject the inert gas, and to circulate the inert gas while exhausting the inert gas through throttle valves 18 arranged downstream of the exhaust valves 16, respectively, to maintain the inert gas concentration of the entire system. The blow-off portions of the wafer space 21 and reticle space 22 preferably form uniform blow-off flows through resistors 19.

When purging the interiors of the temperature-adjusted sealed spaces 21 and 22 with the atmosphere, the shut-off valves 5 and 8 are closed to seal the portion between them, so that the cooler 29 and the filter in the filter box 4 do not come into contact with the atmosphere. In this state, the suction valve 9 and exhaust valve 6 are opened and the blower 34 is started. Then, the atmosphere from which particles and the like are removed with the filter 11 is supplied from the clean room 12 to the wafer space 21 and reticle space 22. The inert gas in the wafer space 21 and reticle space 22 is exhausted via the blower 34, exhaust valve 6, exhaust duct 7, and the like. In this case, the inert gas injection valves 15 are kept closed.

According to this embodiment, even when the interiors of the temperature-adjusted sealed spaces 21 and 22 are to be purged with the atmosphere, since the chemical filter 13 and ULPA filter 14 do not come into contact with the atmosphere, these filters can be prevented from adsorbing the moisture. As the atmosphere does not pass through the cooler 29, no condensed water is generated. Therefore, when purging the atmosphere with the inert gas as well, adverse effects caused by the moisture are avoided, and start-up time is shortened and the throughput is increased thereby. Since the blower (circulating fan) 34 performs displacing with the atmosphere, the time required for purging is very short. This increases the throughput further largely and can make the apparatus compact.

(Other Embodiment)

Figure 4:
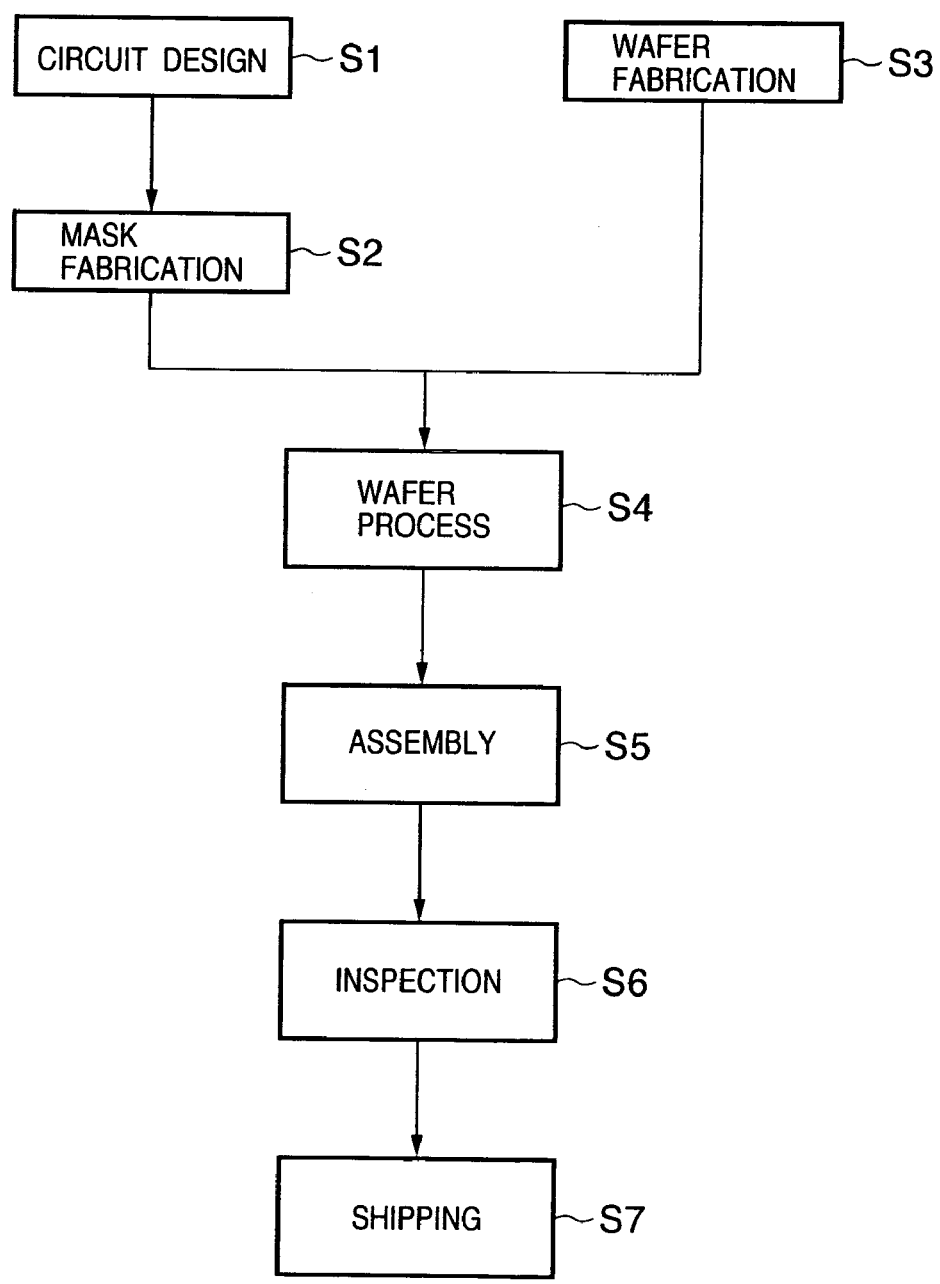
FIG. 4 is a flow chart showing the flow of an overall semiconductor device manufacturing process.

FIG. 4 is a flow chart of an overall semiconductor device manufacturing process using the exposure apparatus described above. In step 1 (circuit design), a semiconductor device circuit is designed. In step 2 (mask fabrication), a mask is fabricated based on the designed circuit pattern. In step 3 (wafer fabrication), a wafer is manufactured by using a material such a silicon. In step 4 (wafer process), called a pre-process, an actual circuit is formed on the wafer by lithography using the prepared mask and wafer. In step 5 (assembly), called a post-process, a semiconductor chip is formed by using the wafer fabricated in step 4, and includes processes such as an assembly process (dicing and bonding) and a packaging process (chip encapsulation). In step 6 (inspection), inspection such as the operation confirmation test and durability test of the semiconductor device fabricated in step 5 are conducted. After these steps, the semiconductor device is completed, and shipped (step 7).

Figure 5:
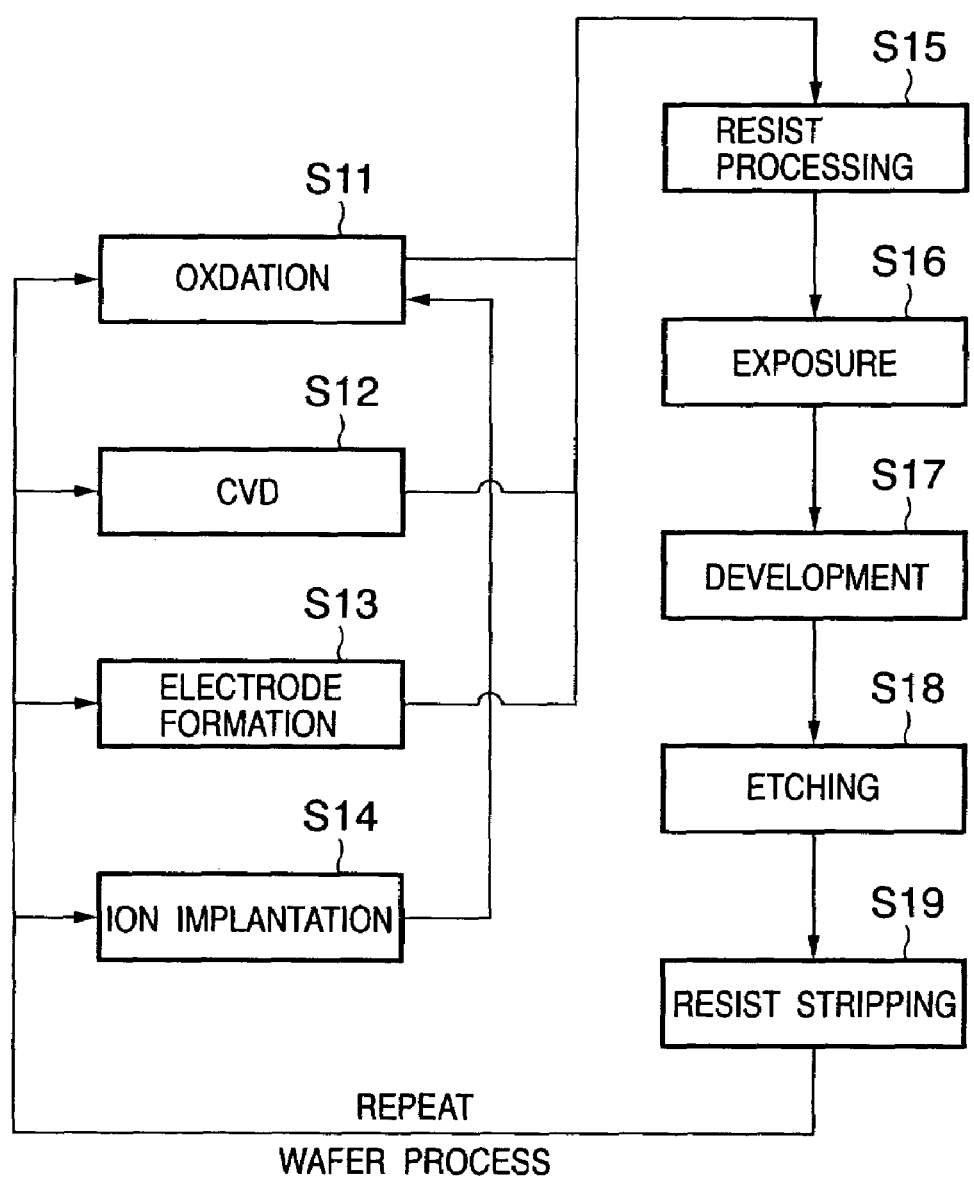
FIG. 5 is a flow chart showing the detailed flow of the wafer process.

FIG. 5 is a flow chart showing the detailed flow of the wafer process. In step 11 (oxidation), the surface of the wafer is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the wafer is moved by using the above exposure apparatus, and the circuit pattern is transferred to the wafer. In step 17 (development), the exposed wafer is developed. In step 18 (etching), the resist is etched except for the developed resist image. In step 19 (resist stripping), an unnecessary resist after etching is removed. These steps are repeated to form multiple circuit patterns on the wafer. Hence, a safe, high-productivity process is enabled.

According to the present invention, a safe, high-productivity temperature adjusting system, and an exposure apparatus incorporating the same can be provided.

As many apparently widely different embodiments of the present invention can be made without departing from the spirit and scope thereof, it is to be understood that the invention is not limited to the specific embodiments thereof except as defined in the appended claims.

What is claimed is:

1. An apparatus comprising:
   a chamber;
   a cooler to cool an inert gas to be supplied to said chamber;
   a circulating path in which the inert gas flows through said chamber and said cooler;
   a first path, connected to said circulating path at a first position downstream of an outlet port of said cooler and upstream of said chamber, to introduce air to said circulating path;
   a second path, connected to said circulating path at a second position downstream of said chamber and upstream of an inlet port of said cooler, to exhaust gas in said chamber;
   a first shut-off valve, arranged in said circulating path upstream of the first position and downstream of the outlet port of said cooler, to close before the introduction of the air; and
   a second shut-off valve, arranged in said circulating path downstream of the second position and upstream of the inlet port of said cooler, to close, to prevent the air from flowing to said cooler.

2. An apparatus according to claim 1, further comprising a filter arranged in said circulating path upstream of said first shut-off valve and downstream of said second shut-off valve.

3. An apparatus according to claim 1, further comprising a blower, arranged in said circulating path upstream of the second position and downstream of said chamber, to cause one of the inert gas and the air to flow.

4. An apparatus according to claim 1, further comprising a third valve, arranged in said first path, to open, to introduce the air to said circulating path.

5. An apparatus according to claim 1, further comprising a fourth valve, arranged in said second path, to open, to exhaust gas in said circulating path.

6. An exposure apparatus for transferring a pattern onto a substrate with exposure light, said apparatus comprising:
   a chamber having therein a space where the exposure light passes;
   a cooler to cool an inert gas to be supplied to said chamber;
   a circulating path in which the inert gas flows through said chamber and said cooler;
   a first path, connected to said circulating path at a first position downstream of an outlet port of said cooler and upstream of said chamber, to introduce air to said circulating path;
   a second path, connected to said circulating path at a second position downstream of said chamber and upstream of an inlet port of said cooler, to exhaust gas in said chamber;
   a first shut-off valve, arranged in said circulating path upstream of the first position and downstream of the outlet port of said cooler, to close before the introduction of the air; and
   a second shut-off valve, arranged in said circulating path downstream of the second position and upstream of the inlet port of said cooler, to close, to prevent the air from flowing to said cooler.

7. A method of manufacturing a device, said method comprising steps of:

transferring a pattern onto a substrate using an exposure apparatus as defined in claim 6;

developing the substrate onto which the pattern has been transferred; and processing the developed substrate to manufacture the device.

* * * * *